(12) United States Patent
Nitschko (10) Patent No.: US 10,843,887 B2
(45) Date of Patent: Nov. 24, 2020

(54) APPARATUS FOR MOUNTING DATA CARRIERS ONTO A CARRIER WEB

(71) Applicant: BW Papersystems Stuttgart GmbH, Nurtingen (DE)

(72) Inventor: Harry Nitschko, Wolfschlugen (DE)

(73) Assignee: BW Papersystems Stuttgart GmbH, Nurtingen (DE)

( * ) Notice: Subject to any disclaimer, the term of this patent is extended or adjusted under 35 U.S.C. 154(b) by 0 days.

(21) Appl. No.: 16/318,336

(22) PCT Filed: Jul. 18, 2017

(86) PCT No.: PCT/IB2017/000840
§ 371 (c)(1),
(2) Date: Apr. 1, 2019

(87) PCT Pub. No.: WO2018/015801
PCT Pub. Date: Jan. 25, 2018

(65) Prior Publication Data
US 2019/0241392 A1    Aug. 8, 2019

(30) Foreign Application Priority Data

Jul. 20, 2016    (DE) .................... 20 2016 004 428 U (51) Int. Cl.
*B65H 29/24*    (2006.01)
*B65H 29/62*    (2006.01)
(Continued)

(52) U.S. Cl.
CPC ......... *B65H 29/242* (2013.01); *B65H 29/243* (2013.01); *B65H 29/245* (2013.01);
(Continued)

(58) Field of Classification Search
CPC .... B65H 29/245; B65H 29/242; B65H 29/62; B65H 43/04; B65H 29/243;
(Continued)

(56) References Cited

U.S. PATENT DOCUMENTS 1,278,537 A * 9/1918 Wegner .................. B65G 15/54
    198/689.1
2,812,079 A   11/1957 Carnine et al.
(Continued)

FOREIGN PATENT DOCUMENTS

DE     4424429 A1    1/1996
DE     19952471 A1   5/2001
(Continued)

OTHER PUBLICATIONS

International Search Report and Written Opinion in corresponding PCT Application No. PCT/IB2017/000840, dated Nov. 10, 2017.
(Continued)

*Primary Examiner* — Mark A Deuble
(74) *Attorney, Agent, or Firm* — Andrus Intellectual Property Law, LLP (57) ABSTRACT

The invention presented and described comprises an apparatus for mounting flat data carriers (1) on a continuous carrier web (2), having a data carrier supply device (3), a data carrier transfer device (4) and a carrier web positioning device (5), wherein the supply device (3) has a drive roller (6), a deflector (7) arranged substantially horizontally spaced apart from the drive roller (6) and at least one carrying belt (8) which runs around the drive roller (6) and deflector (7), wherein the carrying belt (8) has an upper run (9) which runs substantially horizontally in the feed direction of the data carriers (1), and a lower run (10) which runs in the opposite direction below said upper run, wherein the upper run (9) forms a transport path (11) for the data carrier
(Continued)

(1) and is hydraulically connected to a suction box (12) which is arranged beneath in such a way that data carriers (1) which are located on the upper run (9) can be drawn by suction onto the carrying belt (8) by negative pressure, wherein the transfer device (4) has a transfer roller (14), which is provided with intake openings (13) on the circumference and which is hydraulically connected to a negative pressure source in such a way that data carriers (1) located on the outer casing of the transfer roller (14) can be drawn by suction onto the outer casing by negative pressure, wherein the transfer roller (14) has an entry region (15) which is adjacent to the suction box (12) of the supply device (3) and an exit region (16), which is spaced apart from the entry region (15) by a specific angle and is adjacent to the positioning device (5), and wherein at the exit region (16) of the transfer roller (14), a data carrier (1) which is located there on the outer casing of the transfer roller (14) can be transferred onto the carrier web (2).

7 Claims, 4 Drawing Sheets (51) Int. Cl.
  B65H 43/04        (2006.01)
  H01L 21/67        (2006.01)
  G06K 19/077       (2006.01)
  H05K 13/02        (2006.01)
  H01L 21/683       (2006.01)
  B65G 21/20        (2006.01)
  H01L 21/677       (2006.01)

(52) U.S. Cl.
  CPC ............ *B65H 29/62* (2013.01); *B65H 43/04* (2013.01); *G06K 19/07718* (2013.01); *H01L 21/67271* (2013.01); *H05K 13/021* (2013.01); *B65G 21/2036* (2013.01); *B65H 2301/44334* (2013.01); *B65H 2301/44335* (2013.01); *B65H 2301/44336* (2013.01); *B65H 2301/44735* (2013.01); *B65H 2406/33* (2013.01); *B65H 2511/11* (2013.01); *B65H 2513/53* (2013.01); *B65H 2701/192* (2013.01); *B65H 2701/194* (2013.01); *H01L 21/67706* (2013.01); *H01L 21/67736* (2013.01); *H01L 21/6838* (2013.01)

(58) Field of Classification Search
  CPC .......... B65H 2301/44334; B65H 2301/44735; B65H 2701/194; B65H 2701/192; B65H 2406/33; B65H 2301/44335; B65H 2301/44336; B65H 2513/53; B65H 2220/02; B65H 2220/01; B65H 2511/11; H05K 13/021; H05K 13/02; G06K 19/07718; B65G 21/2036; H01L 21/67271; H01L 21/67706; H01L 21/67736; H01L 21/6838

USPC ...................................................... 198/689.1
See application file for complete search history.

(56) References Cited

U.S. PATENT DOCUMENTS

| | | | | |
|---|---|---|---|---|
| 4,200,016 A * | 4/1980 | Helmig | ................ | B65H 29/242 198/462.3 |
| 4,736,831 A | 4/1988 | Fields | | |
| 5,881,860 A * | 3/1999 | Zecchi | ................... | B65G 29/02 198/464.3 |
| 7,296,792 B2 * | 11/2007 | Kondratuk | ........... | B65H 29/242 198/689.1 |
| 2004/0099504 A1 * | 5/2004 | Spatafora | ........... | B65G 21/2036 198/438 |
| 2005/0072654 A1 * | 4/2005 | Fraval | ................ | B65G 47/1492 198/443 |
| 2006/0144521 A1 | 7/2006 | Esposito et al. | | |
| 2007/0252700 A1 | 11/2007 | Ishihara et al. | | |
| 2008/0029221 A1 | 2/2008 | Dangami et al. | | |
| 2008/0223695 A1 * | 9/2008 | Pedersen | ............ | B65G 21/2036 198/689.1 |
| 2010/0236712 A1 | 9/2010 | Basgil et al. | | |
| 2011/0056804 A1 * | 3/2011 | Kearney | ............... | B65H 29/241 198/617 |
| 2011/0293346 A1 * | 12/2011 | Sato | ..................... | B41J 11/0085 400/578 |
| 2014/0378285 A1 * | 12/2014 | Nadachi | ................. | B65H 5/224 493/55 |
| 2015/0096415 A1 * | 4/2015 | Herpell | ................ | B65H 29/242 83/100 |

FOREIGN PATENT DOCUMENTS

| | | |
|---|---|---|
| DE | 102005041024 A1 | 3/2007 |
| DE | 102014104626 A1 | 10/2015 |
| DE | 102016008664 B4 | 10/2019 |
| EP | 0906011 A2 | 3/1999 |
| EP | 1073325 A2 | 1/2001 |
| EP | 1096423 A2 | 5/2001 |
| EP | 1072520 B1 | 10/2003 |
| EP | 1268283 B1 | 6/2004 |
| JP | S60213621 A | 10/1985 |
| JP | H02-139326 A | 5/1990 |
| JP | H06-99961 A | 4/1994 |
| JP | H11-174630 A | 7/1999 |
| JP | 2000-203547 A | 7/2000 |
| JP | 2007-161341 A | 6/2007 |
| JP | 2008-114904 A | 5/2008 |
| JP | 2009-035259 A | 2/2009 |
| JP | 2011-195151 A | 10/2011 |
| KR | 20140032323 A | 3/2014 |
| WO | 2008012633 A2 | 1/2008 |
| WO | 2011051396 A1 | 5/2011 |
| WO | 2012063248 A1 | 5/2012 |

OTHER PUBLICATIONS

Search Report in corresponding German Utility Model Application No. 202016004428.2, dated Jan. 26, 2017.

* cited by examiner

APPARATUS FOR MOUNTING DATA CARRIERS ONTO A CARRIER WEB

CROSS-REFERENCE TO RELATED APPLICATIONS

This application is the U.S. national stage application of International Application PCT/IB2017/000840, filed Jul. 18, 2017, which International Application was published on Jan. 25, 2018, as International Publication WO 2018/015801 in the German language. The International Application claims priority of German Utility Model Application No. 202016004428.2, filed Jul. 20, 2016. The International Application and German Application are both incorporated herein by reference, in their entireties.

The invention relates to an apparatus for mounting flat data carriers on a continuous carrier web having the features of the preamble of claim 1.

The known apparatus on which the invention is based (DE 44 24 429 A1), has e.g. labels or other marking carriers as data carriers. Data carriers can also be, in particular, passive or active electronic data carriers, such as transponders, chips, inlays, or the like (EP 1 268 283 B1). Using the data carrier supply device the data carriers are continuously fed from a storage roll and then separated by means of a cross-cutting device and separated into single units either in this way or else this is done by detachment from a base web initially carrying the data carriers, which also comes from a storage roll, wherein the base web is preferably removed from the region of the supply device by deflection and preferably rolled onto a further storage roll.

To provide an aligned supply of the data carriers the supply device has a deflector arranged horizontally spaced apart from the drive roller, around which at least one carrying belt circulates. The prior art discloses a plurality of carrying belts, which circulate parallel to each other and in each case are held under tension using a belt tensioner. The at least one carrying belt forms an upper run, which passes substantially horizontally in the feed direction of the data carriers, and which forms a transport path for the data carriers. The return section of the carrying belt passes under the upper run in the opposite direction as a lower run.

On the transport path formed by the upper run of the at least one carrying belt the data carriers are fed to the data carrier transfer device in a controlled manner. In order to remain securely on the upper run of the at least one conveyor belt, the data carriers are held on the upper run using a negative pressure generated by a suction box underneath the upper run. At the end of the transport path, i.e. in the region of the deflector, the data carriers are transferred onto a transfer roller of the data carrier transfer device and stick there also, again under negative pressure on their outer casings. From this entry region of the transfer roller, by rotation of the transfer roller through a specific angle the data carriers move into an exit region, which is located adjacent to the guide of a continuous carrying web.

The continuous carrier web is guided on the exit region of the transfer roller in such a way as to ensure that contact between the data carrier to be transferred and the corresponding section of the carrier web is only made at a narrow point of the flow gap for the carrier web formed by a guide roller. The data carrier then sticks to the carrier web and passes with it to the next processing station.

In the prior art on which the invention is based, there is no means of ejecting data carriers from the circuit individually. This may be necessary in operation, for example if an operator recognizes that a data carrier has slipped out of position, is running on the carrying belt at an angle, has the wrong text or has some other error, etc.

The teaching of the present invention is therefore based on the problem, to design and extend the known apparatus for mounting flat data carriers on a continuous carrier web so that a selective individual ejection of data carriers can be easily performed.

The problem raised above is solved in the case of an apparatus having the features of the preamble of claim 1 by the features of the characterizing part of claim 1.

According to the invention it has been recognized that the transport path by the upper run of the carrying belt offers an optimal location from which to remove individual data carriers selectively from the carrying belt. To this end, in accordance with the invention a detachment device is provided on the upper run, with which a data carrier located on the upper run can be removed from the upper run in a controlled manner. The teaching of the invention applies to flat data carriers of all kinds.

Thus, these can be primarily the labels mentioned in the above-mentioned prior art forming the starting point, but in particular they are active or passive electronic flat data carriers. Flat does not necessarily mean completely planar; for data carriers which carry, for example, one or more chips, one or more elevated areas can also be located on the base of the data carrier.

In the context of the teaching of the present invention, at least one circulating carrying belt is provided in the region of the data carrier supply device, but there are preferably a plurality of narrow, parallel circulating carrying belts. The intake openings of the suction box can be located between the carrying belts on the upper run. Preferably, however, the at least one carrying belt will itself have air passage openings, so that the effect of the suction box is applied through the at least one carrying belt onto the data carriers.

In particular for the design solutions for corresponding apparatuses, reference is made in particular to the above-mentioned DE 44 24 429 A1, but additionally to EP 1 268 283 B1.

As a detachment device many different variants would be suitable. Each detachment device must be able to remove a data carrier, which is located along the course of a transport path formed by the upper run, in a selective and controlled manner from the upper run.

According to a first alternative design of the teaching of the invention it is provided that the detachment device is formed by a detachment section located on the suction box in the course of the transport path formed by the upper run, in which an excess pressure can be optionally generated, preferably instead of the negative pressure, on the upper run of the carrying belt, by means of which a data carrier located here can be detached from the upper run in a controlled manner. Here, the detachment device is integrated into the system of the suction box for the conveyor belt. At a certain point on the suction box the detachment section is located, in which optionally and selectively an excess pressure is generated, thus it is preferably possible to switch from negative pressure to excess pressure.

The demarcated segment on the upper run, which forms the detachment section, can be matched in its dimensions to the dimensions of a single data carrier. However, this does not take into account data carriers with different dimensions in the running direction of the conveyor belt. In a particularly preferred alternative variant of this teaching of the invention, the detachment section at the suction box therefore has a comparatively small size in the running direction. Different dimensions of the data carrier to be detached will be allowed for by the time span over which an excess pressure is generated in the detachment section. This time span is matched to the circulation speed of the carrying belt, so that the detachment of the desired data carrier can be perfectly controlled.

In an alternative mechanical design of a detachment device according to the invention it is provided that the detachment device has hinged flaps on the carrying belt, wherein by controlling a single flap a data carrier located on the upper run can be detached from the upper run in a controlled manner.

In a further alternative mechanical design of a detachment device according to the invention it is finally provided that the carrying belt in the course of the transport path formed by the upper run as a detachment device is assigned at least one gripper and/or suction cup, by means of which a data carrier located on the upper run of the carrying belt can be removed from the upper run in a controlled manner.

It has already been pointed out above that the present invention has a particular significance for active or passive electronic data carriers. To this end, according to a particularly preferred teaching of the invention it is provided that a data carrier test device is arranged in the data carrier supply device or in the feed direction of the data carriers before the data carrier supply device. Here, each individual data carrier which passes through it can be tested. By means of a controller, a data carrier identified by the test device as faulty is then removable from the upper run at the detachment section.

In the prior art represented by EP 1 268 283 B1 the data carrier is a transponder and the data carrier test device is a device appropriately matched thereto. Any type of test can be provided, from a pure presence detection to a multi-stage question/answer test of the various functions of such a data carrier.

The essential aspect is that the data carrier test device is arranged in the feed direction of the data carriers such that enough time remains for the device controller to be provided to evaluate the results of the test and then possibly to trigger the removal of a data carrier identified as faulty. The data carrier test device is particularly preferably located within the data carrier supply device and most particularly preferably also in the region of the transport path on the upper run of the carrying belt.

In the particularly preferred alternative design with the detachment section on the suction box, the data carrier test device must be arranged in the feed direction of the data carriers before this detachment section.

In the alternative design with flaps on the upper run, the necessary chronological sequence can be implemented by the controller of the apparatus.

In the implementation of the detachment device by mechanical means using grippers and/or suction cups, it must again be provided that the data carrier test device is arranged in the feed direction of the data carriers before this mechanical detachment device. The typical separation designs of the prior art, i.e. a cross-cutting device or a separating device, can also be used with the apparatus according to the invention.

In addition, there are various ways to guarantee the construction of the apparatus as a whole in terms of an optimal guidance and transfer of the data carriers. This is particularly pertinent in the case of a design in which the transfer roller of the data carrier transfer device forms the drive roller of the data carrier supply device at the same time. In this case, the at least one carrying belt passes completely around the transfer roller of the transfer device. This ensures that the data carriers remain at exactly the same place on the at least one circulating carrying belt during the entire movement from the beginning of the data carrier supply device until the exit region of the data carrier transfer device. For the precision of the transport of the data carriers through the apparatus this is a particularly expedient solution.

This solution can also be combined with a horizontal transport path, so that there are then two carrying belts and two transport paths.

Overall, the apparatus according to the invention is used to generate a carrier web with data carriers, which is free of faulty data carriers. An important feature in this is that without exception, all end products realized in the carrier web have a fault-free data carrier. There must be no gaps present on the carrier web, in which no data carrier is positioned. This is achieved in an apparatus of the type in question by the fact that, by using the transfer device to apply appropriate timing or pausing of the products involved travelling together on the transfer device, consistently functional data carriers are arranged on the carrier web without gaps.

Hereafter the invention will be described in more detail by reference to a drawing showing preferred exemplary embodiment. In each figure in the drawing only the core area of the apparatus according to the invention is shown in each case. Overall, the apparatus also comprises further stations, both in the feed direction of the data carriers before the data carrier supply device as well as in the outlet direction of the carrier web following the data carrier transfer device. But that is not important to the teaching of the invention, so that these parts of a corresponding apparatus are not shown here and are not part of the protected subject matter.

The drawings show

All figures uniformly show the part essential to the invention of an apparatus for mounting flat data carriers 1 on a continuous carrier web 2. The carrier web 2 comes from the bottom left in FIG. 1. It is drawn, for example, from a supply roll, which is not shown in FIG. 1, by means of a drive roller pair.

The apparatus has a data carrier supply device 3, a data carrier transfer device 4 and a carrier web positioning device 5.

Figure 1:
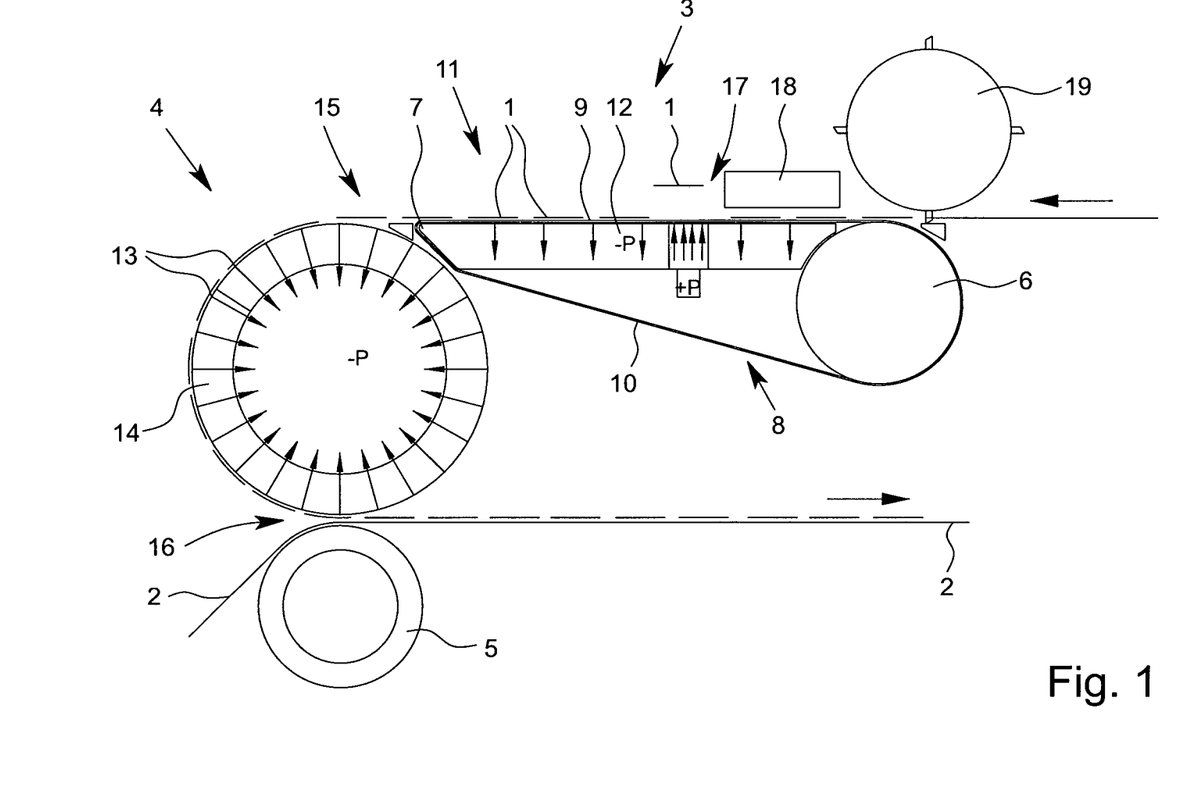
FIG. 1 in a schematic drawing in a side view, a first exemplary embodiment of an apparatus according to the invention, FIG. 2 in a schematic drawing in a side view, a second exemplary embodiment of an apparatus according to the invention, FIG. 3 in a schematic drawing in a side view, a third exemplary embodiment of an apparatus according to the invention, FIG. 4 in a schematic drawing in a side view, a fourth exemplary embodiment of an apparatus according to the invention.

The carrier web positioning device 5 is here implemented as a motor-driven positionable deflection roller for the carrier web 2, by means of which the carrier web 2 in FIG. 1 can be horizontally deflected to the right. Next to the cut end of the carrier web 2 shown on the right in FIG. 1, further processing stations of the apparatus follow, in particular also including a transport or discharge station. The positioning for the carrier web 2 can be performed by motors, for example, but also pneumatically or hydraulically.

The data carrier supply device 3 in the exemplary embodiment shown in FIG. 1 has a drive roller 6 and a deflector 7 which is spaced apart from the drive roller 6. The deflector 7 here is designed as a passive deflection contour, but can also be implemented as a roller. The deflector 7 is spaced substantially horizontally from the drive roller 6. This means that, as shown in FIG. 1, the top edge of the deflector 7 is at approximately the same height as the top edge of the drive roller 6.

The data carrier supply device 3 also comprises at least one carrying belt 8 circulating about a drive roller 6 and deflector 7. Preferably, a plurality of carrying belts running parallel to each other 8 are provided. The at least one carrying belt 8 is preferably guided under tension, for which purpose, for example, a known belt tensioning device can be provided, but this is not shown in FIG. 1.

The carrying belt 8, due to its guidance around the drive roller 6 and deflector 7, has an upper run 9 which runs substantially horizontally in the feed direction of the data carriers 1, shown in FIG. 1 by an arrow, and a lower run which runs in the opposite direction below said upper run. The upper run 9 forms a transport path 11 for the data carriers 1. It is hydraulically connected to a suction box 12 arranged beneath it in such a way that data carriers 1 located on the upper run 9 can be drawn by suction onto the carrying belt 8 by negative pressure. The suction box 12 is connected to a suction pump, not shown in FIG. 1, which generates the negative pressure.

In FIG. 1 the data carriers 1 resting on the upper run 9 of the carrying belt 8 can be seen, which are held on the carrying belt 8 by negative pressure. The negative pressure is represented by the downward pointing arrows and the symbol "−P".

The data carrier transfer device 4 has a transfer roller 14 which is provided with intake openings 13 on the circumference and which is hydraulically connected to a negative pressure source in such a way that data carriers 1 that are located on the outer casing of said rollers can be drawn by suction onto the outer casing by the negative pressure. FIG. 1 shows the data carrier 1 directly on the outer casing of the transfer roller 14. The negative pressure produced by the intake openings 13 is marked by arrows pointing radially inward and the symbol "−P".

The transfer roller 14 has an entry region adjacent to the suction box 12 of the supply device 3 and an exit region 16, which is spaced apart from the entry region 15 by a specific angle, here an angle of approximately 180°, and adjacent to the carrier web positioning device.

It can be seen in FIG. 1 that the data carriers 1 are transported by rotation of the drive roller 6 from the upper entry region area down to the exit region 16.

At the exit region 16 of the transfer roller 14 a data carrier 1 located there on the outer casing of the transfer roller 14 can be transferred onto the carrier web 2. This can be seen on the flow gap between the exit region 16 of the transfer roller 14 and the top of the roller that forms the positioning device 5.

The data carriers 1 can be coated with an adhesive layer on the upper side in FIG. 1 in the entry region 15 and on the lower side in the exit region 16, so that in the carrier web positioning device 5 they adhere to the carrier web 2 drawn between them. In the exemplary embodiment shown and preferred here however, the data carriers 1 are not designed to be adherent. This is not necessary, because they are simply cut to length from an incoming data carrier web. In this case, however, the carrier web 2 is designed to be adherent on its upper side according to FIG. 1, so that the data carriers 1 adhering to the outer circumference of the transfer roller 14 by negative pressure in the region of the carrier web positioning device 5, thus at the exit region 16 of the transfer roller 14, adhere so strongly to the carrier web 2 that the hydraulic suction force on the transfer roller 14 is overcome. Adhering can mean sticking, but this may also be realized differently, for example electrostatically. In principle, both can be realized, i.e., data carrier 1 and carrier web 2 can be equipped to be adhesive.

The roller that forms the positioning device 5 can run continuously or it can also be repeatedly positioned at specific points on the transfer roller 14 by means of a positioning drive in the exit region 16, in order to individually connect a specific data carrier 1 to the carrier web 2. For this purpose, a wide variety of variants of the control process are known in the prior art, to which reference may be made.

Overall, the device can be operated continuously or in a clocked manner, and here, also, there are numerous examples in the prior art. A particularly preferred method though is a clocked operation of the apparatus, for the reasons set out in the introductory part of the general description.

According to the invention a detachment device is then provided on the upper run 9, with which a data carrier 1 located on the upper run 9 can be removed from the upper run 9 in a controlled manner. The preferred exemplary embodiment shows a pneumatic detachment device. In principle, however, mechanical detachment devices are also possible.

In a first alternative design, but not shown in the drawing, the detachment device has hinged flaps on the carrying belt 8. By activating a single flap a data carrier 1 located on the upper run 9 can be detached from the upper run 9 in a controlled manner. In a second alternative design, also not shown in the drawing, the detachment device has a mechanical flap located between the plurality of parallel running carrying webs 8 on the upper run 9. This flap can be swung up in between the continually circulating 9 carrying belts 8 and thereby detach the data carrier 1 from the upper run 9. This flap is stationary, and thus does not need to circulate with the carrying belt 8.

In another mechanical variant the carrying belt 8 is assigned at least one gripper and/or suction cup as a detachment device. A data carrier 1 located on the upper run 9 of the carrying belt 8 can be removed from the upper run 9 in a controlled manner using the gripper and/or suction cup and is thus selectively removed from the carrying belt 8.

For a preferably pneumatic detachment device, FIG. 1 now shows that on the suction box 12 in the course of the transport path 11 formed by the upper run 9, a detachment section 17 is present in which an excess pressure can be optionally generated on the upper run 9 of the carrying belt 8, by means of which a data carrier 1 which is located here can be detached from the upper run 9 in a controlled manner. In the detachment section 17 visible in FIG. 1 the pressure applied to the upper run 9 from the suction box 12 can be a negative pressure (−P). But if needed it can also be an excess pressure, illustrated by the upward pointing arrows and the symbol "+P". This can be generated optionally by an additional pressure source, such as an overpressure generator. It can be generated whenever a specific data carrier 1 needs to be detached from the carrying belt 8, i.e. ejected or removed from the apparatus.

The apparatus described up to now is applicable to data carriers 1 of all kinds, even to those where ejection of the data carriers 1 is initiated, for example, by a visual check by an operator.

The teaching of the invention is of particular importance when the data carriers 1 are, for example, passive or active electronic data carriers 1, for example transponders.

The preferred exemplary embodiment shown in FIG. 1 shows, to the extent that it is applicable to all data carriers 1 but particularly suitable for active or passive electronic data carriers 1, that in the data carrier supply device 3 (as shown specifically here) or in the feed direction of the data carriers 1 before the data carrier supply device 3 and here also in the feed direction of the data carriers 1 before the detachment section 17, a data carrier test device 18 is arranged, with which each individual data carrier 1 passing through can be tested. By means of a controller, a data carrier 1 identified by the test device 18 as faulty is removable from the upper run 9 at the detachment section 17.

The controller, which is not shown in detail in FIG. 1, is required in order to provide overall control of the processes of the apparatus. In this context reference may be made to the prior art explained above, in particular to that of EP 1 268 283 B1.

The data carrier test device 18 is used to determine whether the data carrier 1 is in good order. This can be, for example, a visual inspection of a passive, non-electronic data carrier 1, for example with regard to its presence and/or positioning on the carrying belt 8.

A data carrier test device 18 is of particular importance for active or passive electronic data carriers 1, in particular for transponders, such as RFID chips, inlays, etc. In this respect also, reference is made to the prior art mentioned above.

In the exemplary embodiment shown in FIG. 1, the data carrier test device 18 is seated in the region of the data carrier supply device 3 itself and just in front of the detachment section 17 of the transport path 11 in the feed direction of the data carriers 1. The distance is dimensioned in such a way that the evaluation of test data of the respective data carrier 1 proceeds fast enough that the activation of excess pressure in the detachment section 17 is exactly matched to the corresponding data carrier 1, when this should be necessary.

In principle, the data carrier test device 18 can also be arranged substantially further forward in the feed direction of the data carriers 1, thus further to the right in FIG. 1. The essential point is that the time taken by the data carrier 1 in question from the data carrier test device 18 to the detachment section 17 is properly taken into account in the control process. The controller can also control the length of time in which an excess pressure is generated in the detachment section 17, in accordance with the relevant dimensions of the data carrier 1 in the feed direction. The detachment section 17 could then be significantly shorter in the feed direction than shown in the drawing. Depending on the size of the data carrier 1 the detachment section 17 would simply have pressure applied for a shorter or longer time.

For the mechanical detachment devices, which have been elaborated above and in the general part of the description, similar considerations apply.

The exemplary embodiment shown in FIG. 1, and in this regard preferred, is characterized in that in the feed direction of the data carriers 1 at the beginning of the data carrier supply device 3 a cross-cutting device 19 is arranged, with which the incoming data carriers 1, in the form of a contiguous data carrier web 2, can be separated. This corresponds to the technology known from the source DE 44 24 429 A1 forming the prior art, but also from EP 1 268 283 B1.

Figure 4:
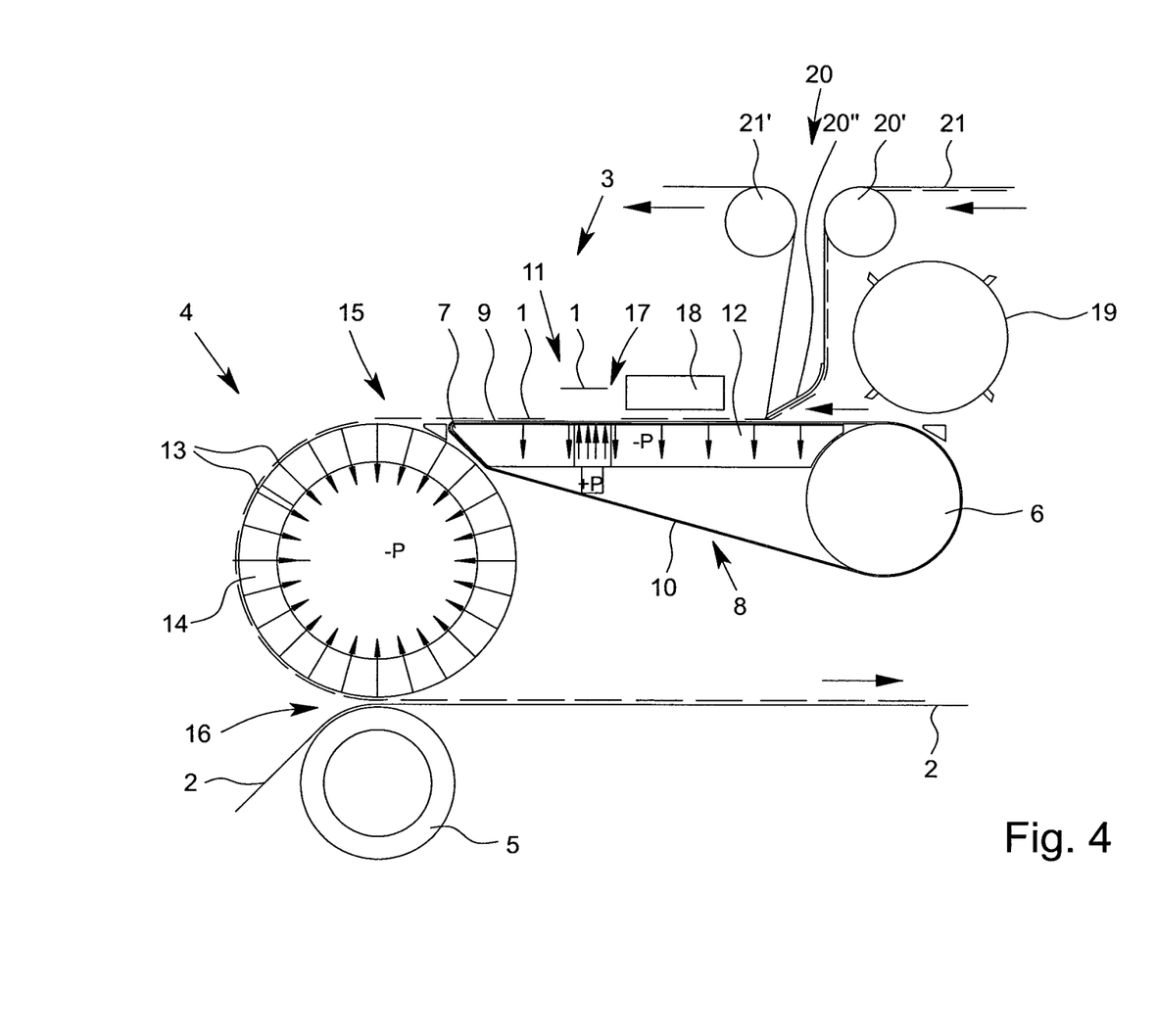

The alternative design shown in FIG. 4 is based on a design in which it is provided that a separating device 20 with a deflection roller 20' and separator plate 20" is arranged at the beginning of the data carrier supply device 3 in the feed direction of the data carriers 1, with which the individually detachable data carriers 1 mounted on a contiguous base web 21 can be detached from the base web 21 and deposited on the upper run 9. This is a technique in which the data carriers 1 are already arranged on a contiguous base web 21 in separated form and are then individually detached from this and deposited on the upper run 9. The base web 21 itself is then wound up in the direction of a supply roll 21'.

With the design shown in FIG. 1 it is possible, in a simple way, namely by using the already existing transport path 11, to implement the removal of unusable data carriers 1. The same applies to the alternative design of FIG. 4.

Figure 2:
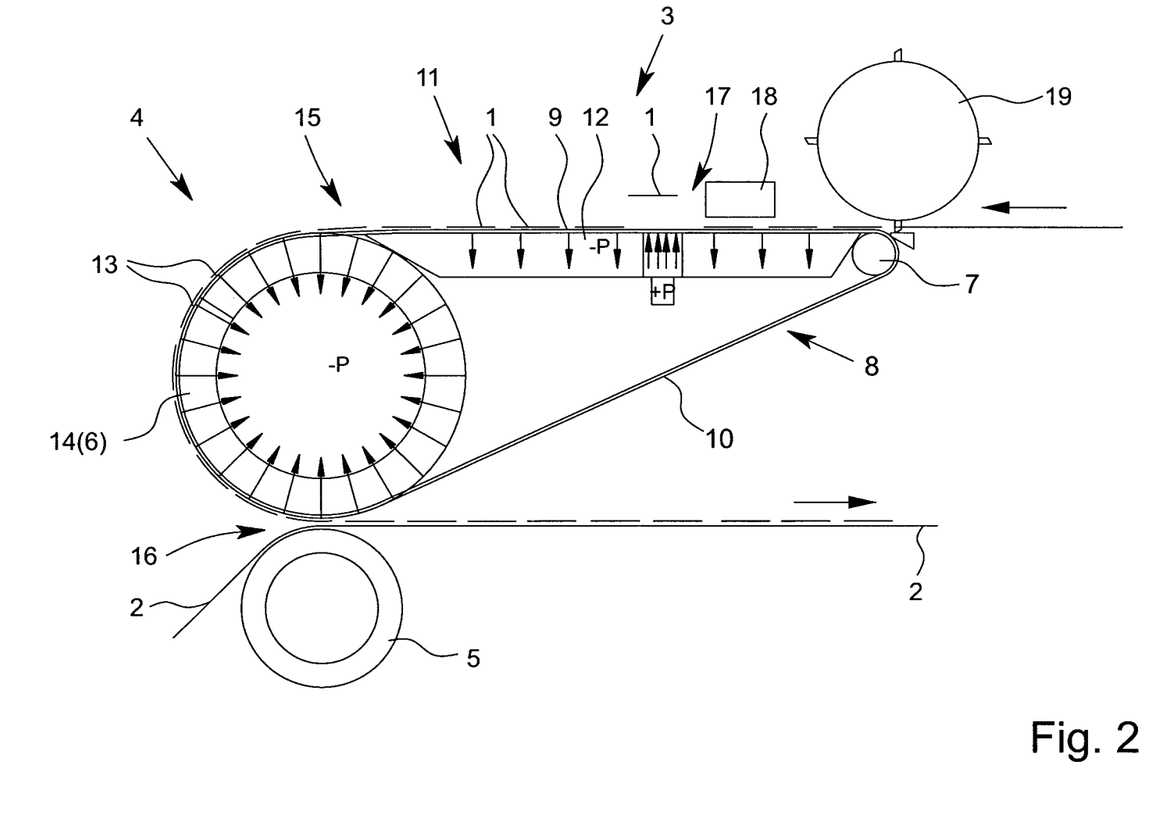
Figure 3:
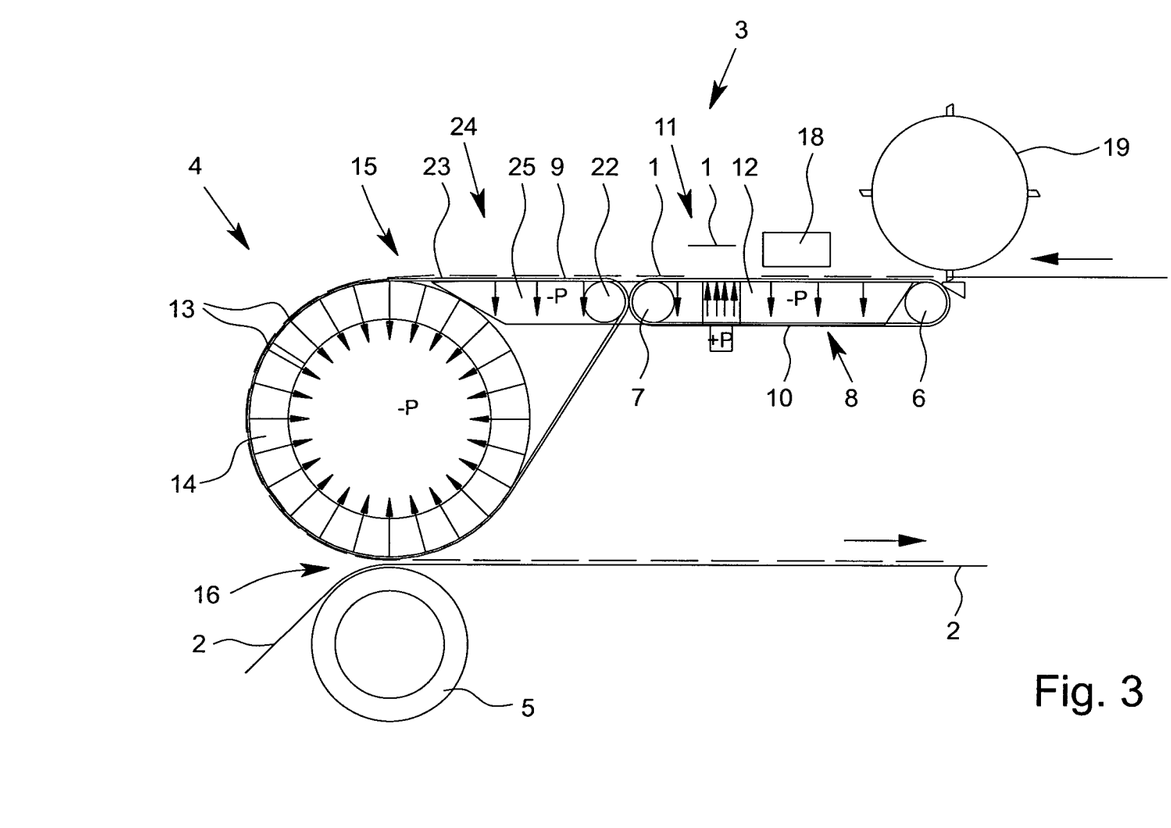

The variants of FIGS. 2 and 3 also have the same advantage, although the design of the device has been chosen slightly differently.

In the design of FIG. 2, it is provided that the transfer roller 14 of the data carrier transfer device 4 acts as the drive roller 6 of the data carrier supply device 3 at the same time. The same reference numerals have been used for the same components as in FIG. 1.

It can be seen in FIG. 2 that the carrying belt 8 here travels a much longer distance than in the design shown in FIG. 1. That has to do with the fact that the carrying belt 8 here is wound around the transfer roller 14 of the data carrier transfer device 4. At the opposite end the deflector 7 is designed as a deflection roller. As a result of this design, the negative pressure in the interior of the transfer roller 14 (represented by "−P") acts through the at least one carrying belt 8 which is guided on the circumference of the transfer roller 14 onto the data carriers 1. A data carrier 1, which has arrived on the carrying belt 8 at the entrance of the data carrier supply device 3, thus here directly behind the cross-cutting device 19 in the feed direction, remains at this position of the carrying belt 8 over the entire transport path 13 and on the entire relevant sub-region of the circumference of the transfer roller 14 up to the exit region 16. There are no interim transfer points, which could adversely affect the position of the data carrier 1 on the carrying belt 8. This is therefore a particularly expedient design.

FIG. 3 shows a further design variant, which is a combination of the variants from FIG. 1 and FIG. 2. The same reference numerals are also used for the same components here.

In the variant shown in FIG. 3, it is provided that the transfer roller 14 of the data carrier transfer device 4, together with a second deflector 22, which is arranged substantially horizontally spaced apart from the transfer roller 14 opposite the feed direction of the data carriers 1, and a second carrier belt 23 running around both, forms a second transport path 24 for the data carriers 1, which is joined to the first transport path 11 in the feed direction of the data carriers 1. The first deflector 7 here is also a deflection roller. The drive roller 6 and the deflector 7 can also change places, they are equivalent here.

The transfer from the first carrying belt 8 to the second carrying belt 23 takes place here in the region of a continued horizontal transport path 24, this transition is therefore highly fail-safe. In the region of the transfer roller 14 the same advantage is obtained here as in the exemplary embodiment of FIG. 2, namely that the at least one carrying belt 23 here is also fully wound around the transfer roller 14. In total it is also the case here, of course, that a plurality of parallel running carrying belts 23 are preferably provided.

As a general rule, the at least one carrying belt 8; 23 is preferably provided with intake openings for air, so that the negative pressure at the suction box 12, at the second suction box 25 and at the transfer roller 14 always acts on the data carriers 1 through the at least one carrying belt 8, hence more or less over the whole surface of the data carriers 1.

LIST OF REFERENCE NUMERALS

1 data carrier
2 carrier web
3 data carrier supply device
4 data carrier transfer device
5 carrier web positioning device
6 drive roller
7 deflector
8 carrying belt
9 upper run
10 lower run
11 first transport path
12 suction box
13 intake opening
14 transfer roller
15 entrance region
16 exit region
17 detachment section
18 data carrier test device
19 cross-cutting device
20 separating device
20' deflection roller
20" separator plate
21 base web
21' supply roll
22 second deflector
23 second carrying belt
24 second transport path
25 second suction box

The invention claimed is:

1. Apparatus for mounting flat data carriers on a continuous carrier web, having:
   a data carrier supply device,
   a data carrier transfer device, and
   a carrier web positioning device,
   wherein the supply device has a drive roller, a deflector arranged substantially horizontally spaced apart from the drive roller and at least one carrying belt which runs around the drive roller and deflector,
   wherein the carrying belt has an upper run which runs substantially horizontally in the feed direction of the data carriers and a lower run which runs in the opposite direction below said upper run,
   wherein the upper run forms a transport path for the data carrier and is hydraulically connected to a suction box, which is arranged beneath in such a way that data carriers which are located on the upper run can be drawn by suction onto the carrying belt by negative pressure,
   wherein the transfer device has a transfer roller which is provided with intake openings on the circumference and which is hydraulically connected to a negative pressure source in such a way that data carriers that are located on the outer casing of the transfer roller can be drawn by suction onto the outer casing by negative pressure,
   wherein the transfer roller has an entry region which is adjacent to the suction box (of the supply device (and an exit region which is spaced apart from the entry region (by a specific angle and is adjacent to the positioning device, and wherein, at the exit region (of the transfer roller, a data carrier which is located there on the outer casing of the transfer roller can be transferred onto the carrier web, and
   wherein a detachment device is provided on the upper run, with which a data carrier located on the upper run can be removed from the upper run in a controlled manner.

2. Apparatus according to claim 1, wherein the detachment device is formed by a detachment section located on the suction box in the course of the transport path formed by the upper run, in which an excess pressure can be optionally generated on the upper run of the carrying belt, by means of which a data carrier which is located here can be detached from the upper run in a controlled manner.

3. Apparatus according to claim 1, wherein in the data carrier supply device or in the feed direction of the data carriers before the data carrier supply device, a data carrier test device is arranged, with which each individual data carrier passing through this point can be tested, and that by means of a controller a data carrier identified by the test device as faulty is removable from the upper run.

4. Apparatus according to claim 1, wherein in the feed direction of the data carriers at the beginning of the data carrier supply device a cross-cutting device is arranged, with which the incoming data carriers, in the form of a contiguous data carrier web, can be separated.

5. Apparatus according to claim 1, wherein in the feed direction of the data carriers at the beginning of the data carrier supply device a separating device is arranged, with which the data carriers, which are individually detachably mounted on a contiguous base web, can be detached from the base web and deposited on the upper run of the carrying belt.

6. Apparatus according to claim 1, wherein the transfer roller of the data carrier transfer device is at the same time the drive roller of the data carrier supply device.

7. Apparatus according to claim 1, wherein the transfer roller of the data carrier transfer device, together with a second deflector which is arranged substantially horizontally spaced apart from the transfer roller opposite the feed direction of the data carriers, and with a second carrier belt running around both, forms a second transport path for the data carriers, which is joined to the first transport path in the feed direction of the data carriers.

\* \* \* \* \*